United States Patent
Lipcsei et al.

(10) Patent No.: US 7,466,113 B2
(45) Date of Patent: Dec. 16, 2008

(54) BREAK-BEFORE-MAKE SENSING FOR DRIVERS

(75) Inventors: Laszlo Lipcsei, Campbell, CA (US); Serban-Mihai Popescu, Campbell, CA (US)

(73) Assignee: 02Micro International Limited, Georgetown, Grand Caymon (KY)

( * ) Notice: Subject to any disclaimer, the term of this patent is extended or adjusted under 35 U.S.C. 154(b) by 917 days.

(21) Appl. No.: 10/885,847

(22) Filed: Jul. 7, 2004

(65) Prior Publication Data

US 2006/0006932 A1 Jan. 12, 2006

(51) Int. Cl.
*G05F 1/00* (2006.01)
*H02H 9/00* (2006.01)

(52) U.S. Cl. .................. 323/266; 323/271; 323/282; 361/21.01; 361/58; 361/76; 327/566

(58) Field of Classification Search ................ 327/565; 323/282, 56, 351; 361/58, 78
See application file for complete search history.

(56) References Cited

U.S. PATENT DOCUMENTS

| | | | | |
|---|---|---|---|---|
| 5,610,503 A | * | 3/1997 | Fogg et al. | 323/283 |
| 5,815,427 A | * | 9/1998 | Cloud et al. | 365/51 |
| 6,025,705 A | * | 2/2000 | Nguyen et al. | 323/282 |
| 6,269,451 B1 | * | 7/2001 | Mullarkey | 713/401 |
| 6,459,343 B1 | * | 10/2002 | Miller | 333/32 |
| 2002/0154464 A1 | * | 10/2002 | Vinciarelli et al. | 361/58 |

OTHER PUBLICATIONS

English translation of Chinese Office Action issued in related Chinese Patent Application No. 2005100844x (2 pages).

* cited by examiner

*Primary Examiner*—Vibol Tan
(74) *Attorney, Agent, or Firm*—Grossman, Tucker, Perreault & Pfleger, PLLC

(57) ABSTRACT

A driver package includes an integrated circuit (IC) comprising pull up circuitry capable of turning ON an associated switch and pull down circuitry capable of turning OFF the associated switch. The pull up circuitry may be coupled to a first bonding pad of the IC, and the pull down circuitry may be coupled to a second bonding pad of the IC. The driver package may further comprise a first conductive path coupled between the first bonding pad and a package pin of the driver package, where the package pin is coupled to the associated switch, and a second conductive path coupled between the second bonding pad and the package pin. The first conductive path may further provide a sensed signal representative of state of the associated switch to break before make control circuitry to assist in minimizing a break before make delay time interval.

12 Claims, 5 Drawing Sheets

BREAK-BEFORE-MAKE SENSING FOR DRIVERS

FIELD

This disclosure relates to break-before-make sensing for drivers.

BACKGROUND

A driver may be utilized to drive one or more switches to various conductive states. In one embodiment, a driver may be utilized to drive switches of a DC to DC converter. Such a DC to DC converter may convert an input DC voltage to an output DC voltage in response to driving signals from the driver. One type of DC to DC converter may have a pair of switches, e.g., a high-side switch and a low-side switch, arranged in a half bridge configuration responsive to drive signals from the driver to alternately turn ON and OFF in order to control the output DC voltage. In this situation, a short fault condition may occur if both the high and low side switch are ON simultaneously.

In order to avoid such a short fault condition, a driver may have break-before-make (BBM) control circuitry to ensure that one of the switches is OFF before the other switch is turned ON. The switches may be implemented as metal oxide semiconductor field effect transistors (MOSFETs). The BBM control circuitry may sense a voltage level between the gate and source terminals of the external MOSFET and compare it to a BBM threshold voltage level to determine a state of the MOSFET. If the gate to source voltage level is below the BBM threshold voltage level, it is determined the MOSFET is OFF.

However, a prior art driver embodiment may utilize the same bonding wire between a bonding pad of an integrated circuit and a package pin of the driver package for sensing the voltage level at the gate of the external MOSFET and for driving the MOSFET. Therefore, when a large driving current is delivered via this bonding wire an associated large voltage drop may occur. This may in turn degrade the reliability of the sensing function since the sensed voltage signal may be lowered due to the voltage drop caused by the large driving current.

For example, when such a driver is driving the external MOSFET OFF a driving current signal provided along this single bonding wire may result in a large voltage drop. This large voltage drop may then interfere with the sensed signal such that the sensed signal is low enough to inadvertently indicate the external MOSFET is OFF when it actually is ON. This could then lead to the driver to drive both the high and low side switches ON at the same time creating a short fault condition between the high and low side switch. To avoid this situation, a prior art embodiment adds an extra time delay into the BBM sequence. However, this extra delay leads to a sub-optimal driving of the high and low side switches.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
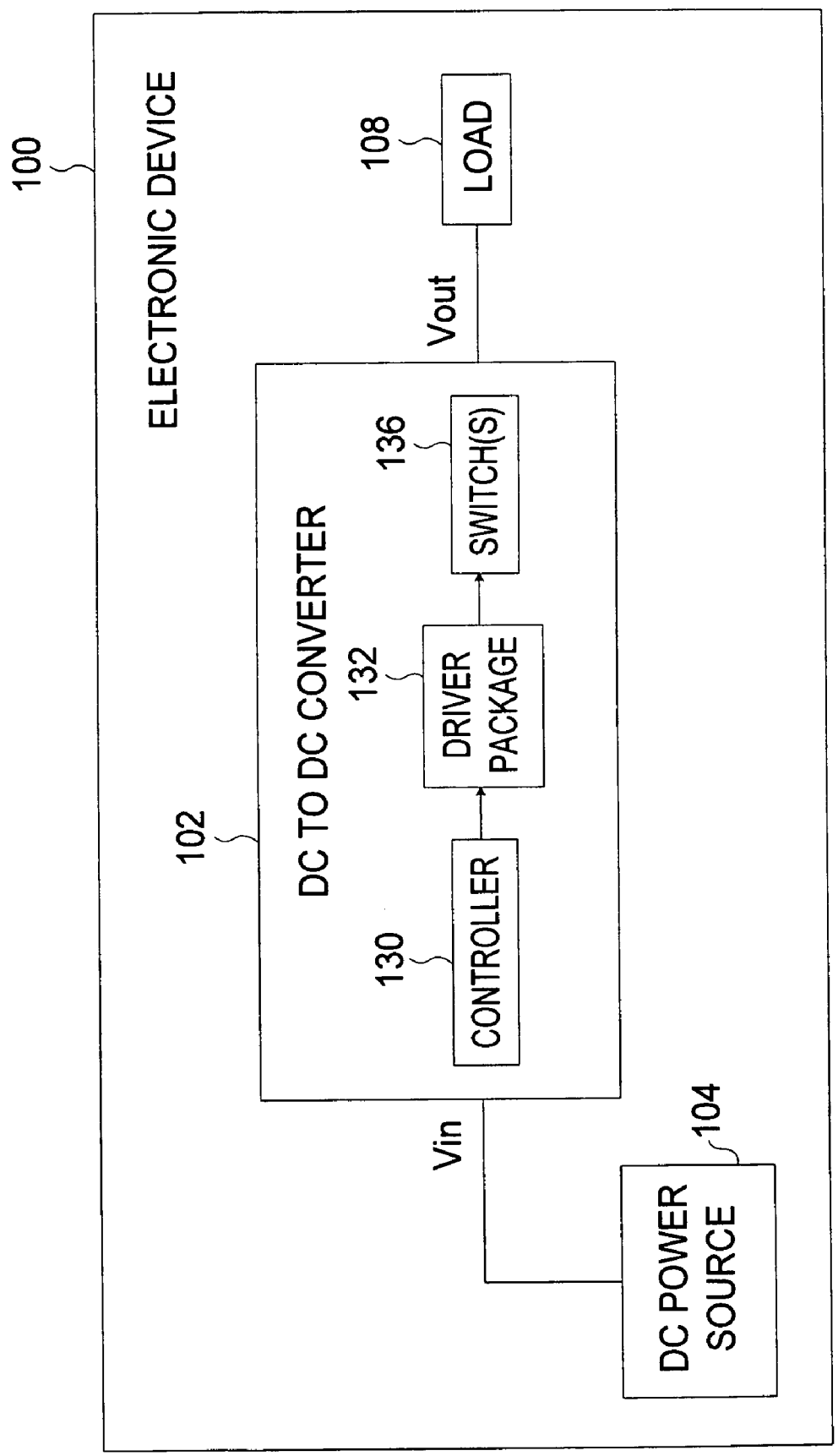
FIG. 1 is a block diagram of an electronic device having a DC to DC converter with a driver package consistent with an embodiment.

FIG. 1 illustrates an electronic device 100 with a DC to DC converter 102 having a driver package 132 consistent with an embodiment. The electronic device 100 may be any variety of electronic devices, including, but not limited to, a server computer, a desk top computer, a lap top computer, cell phone, personal digital assistant, etc. The electronic device 100 may receive power from any variety of power sources such as a DC power source 104. The DC power source may be any variety of power sources such as, for example, an AC/DC adapter.

The DC to DC converter 102 may accept an input voltage Vin from the DC power source 104 and provide an output voltage Vout to a load 108. The DC to DC converter 102 may include a controller 130, a driver package 132 consistent with an embodiment, and one or more switches 136 to perform the conversion of the input DC voltage Vin to the output DC voltage Vout. The load 108 may be any variety of loads including a processor. The load may also be a rechargeable battery in a battery charging application. A rechargeable battery may include any type of rechargeable battery such as lithium-ion, nickel-cadmium, nickel-metal hydride batteries, or the like.

Figure 2:
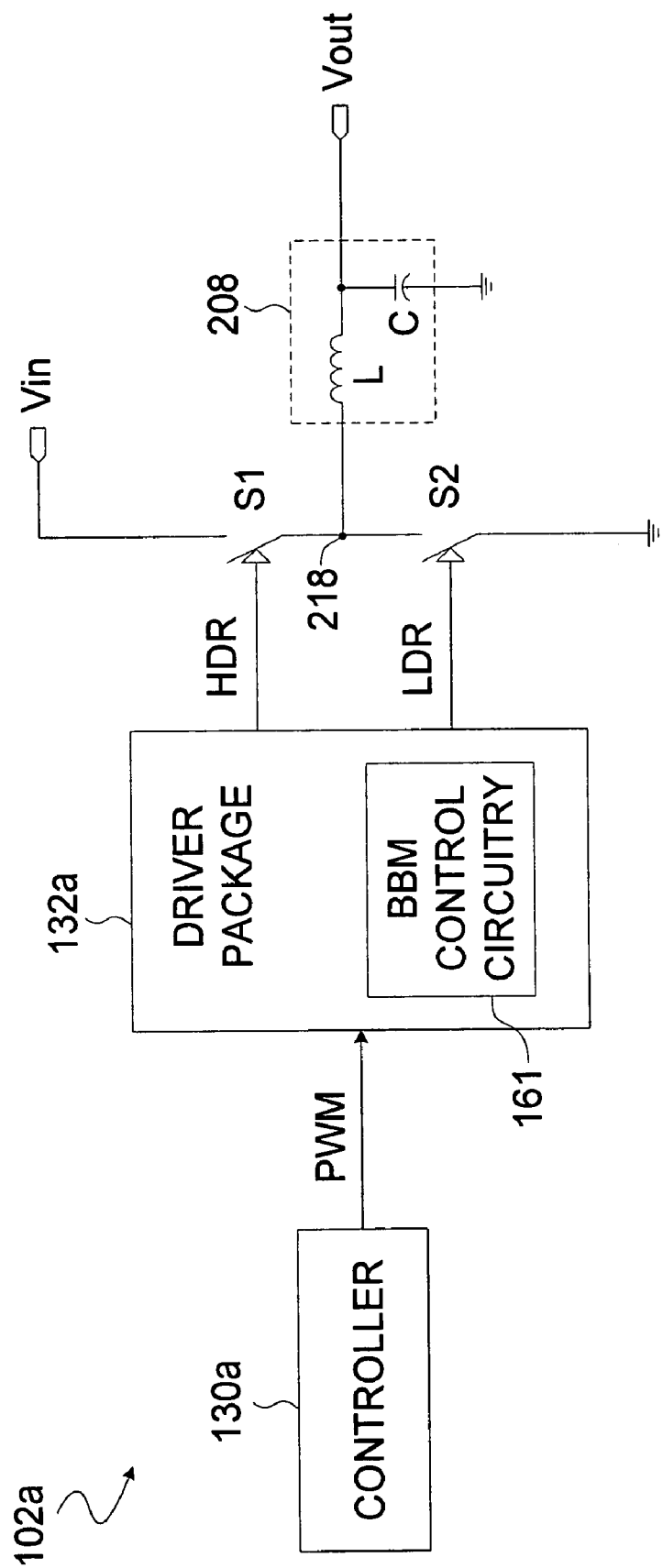
FIG. 2 is diagram of an embodiment of the DC to DC converter of FIG. 1.

FIG. 2 illustrates an embodiment of a DC to DC converter 102*a* consistent with the DC to DC converter 102 of FIG. 1. In general, the DC to DC converter 102*a* receives an input DC voltage, Vin, and provides a desired output DC voltage, Vout. The DC to DC converter 102*a* may include a controller 130*a*, a driver package 132*a* consistent with an embodiment, a pair of switches S1 and S2 arranged in a half-bridge configuration, and a low pass filter 208. The low pass filter may include an inductor L and capacitor C. The controller 130*a* may provide a control signal, e.g., a PWM signal, to the driver package 132*a* in response to any variety of input signals. In response, the driver package 132*a* may provide HDR and LDR drive signals to the respective switches S1 and S2 in order to alternately drive switches S1 and S2 ON and OFF thereby controlling inductor current through the inductor L and the output voltage Vout of the DC to DC converter 102*a*. Switch S1 is referred to herein as a high-side switch because when closed it couples node 218 to the input voltage Vin, and switch S2 is referred to herein as a low-side switch because when closed it couples node 218 to ground. The driver package 132*a* may further include break-before-make (BBM) control circuitry 161 to ensure that one of the switches S1 or S2 is OFF before the other is turned ON.

Figure 3:
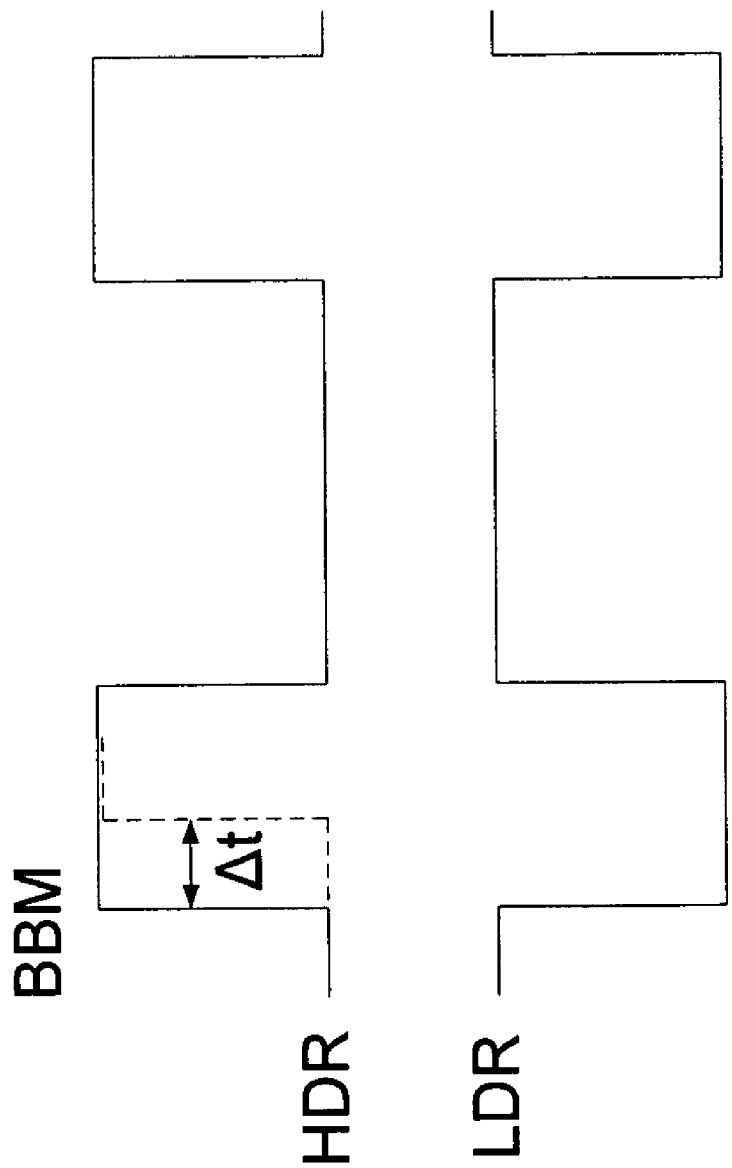
FIG. 3 is a timing diagram of driving signals provided by the driver package of FIG. 2.

FIG. 3 is a timing diagram of the HDR and LDR signals that may be provided by the driver package 132*a* to switches S1 and S2. The driver package 132*a* may provide the HDR drive signal coincident with the input PWM signal from the controller 130*a* and may provide the LDR drive signal having a substantially opposite phase of the HDR signal, e.g., signal LDR is high when HDR is low and vice versa. In response to a digital one PWM signal, the driver package 132*a* may provide a digital one HDR signal to drive the high-side switch S1 ON and a digital zero LDR signal to drive the low-side switch S2 OFF. This state of switches will be referred to herein as a "switch ON" state. In this state, the inductor L is coupled to the input voltage source Vin. In a buck converter, the input voltage is necessarily greater than the output voltage so there is a net positive voltage across the inductor L in this switch ON state. Accordingly, the inductor current begins to ramp up.

If the PWM signal from the controller 130a is a digital zero, the driver package 132a may provide a digital zero HDR signal to drive the high-side switch S1 OFF and a digital one LDR signal to drive the low-side switch S2 ON. This state of switches will be referred to as a "switch OFF" state. In a buck converter, there is a net negative voltage across the inductor L in this state. Accordingly, the inductor current begins to ramp down during this switch OFF state. Hence, the pulse width of the PWM signal determines the time on for the switch ON state and the time off for the switch OFF state. A short fault condition may occur if switches S1 and S2 were inadvertently ON at the same time. To protect against this condition, the BBM control circuitry 161 may make sense a state of the switch to ensure that one switch (S1 or S2) is OFF before the other switch is turned ON. A BBM time interval delay of Δt may elapse while this BBM control circuitry is performing its function. It would be beneficial to minimize this BBM time interval delay.

Figure 4:
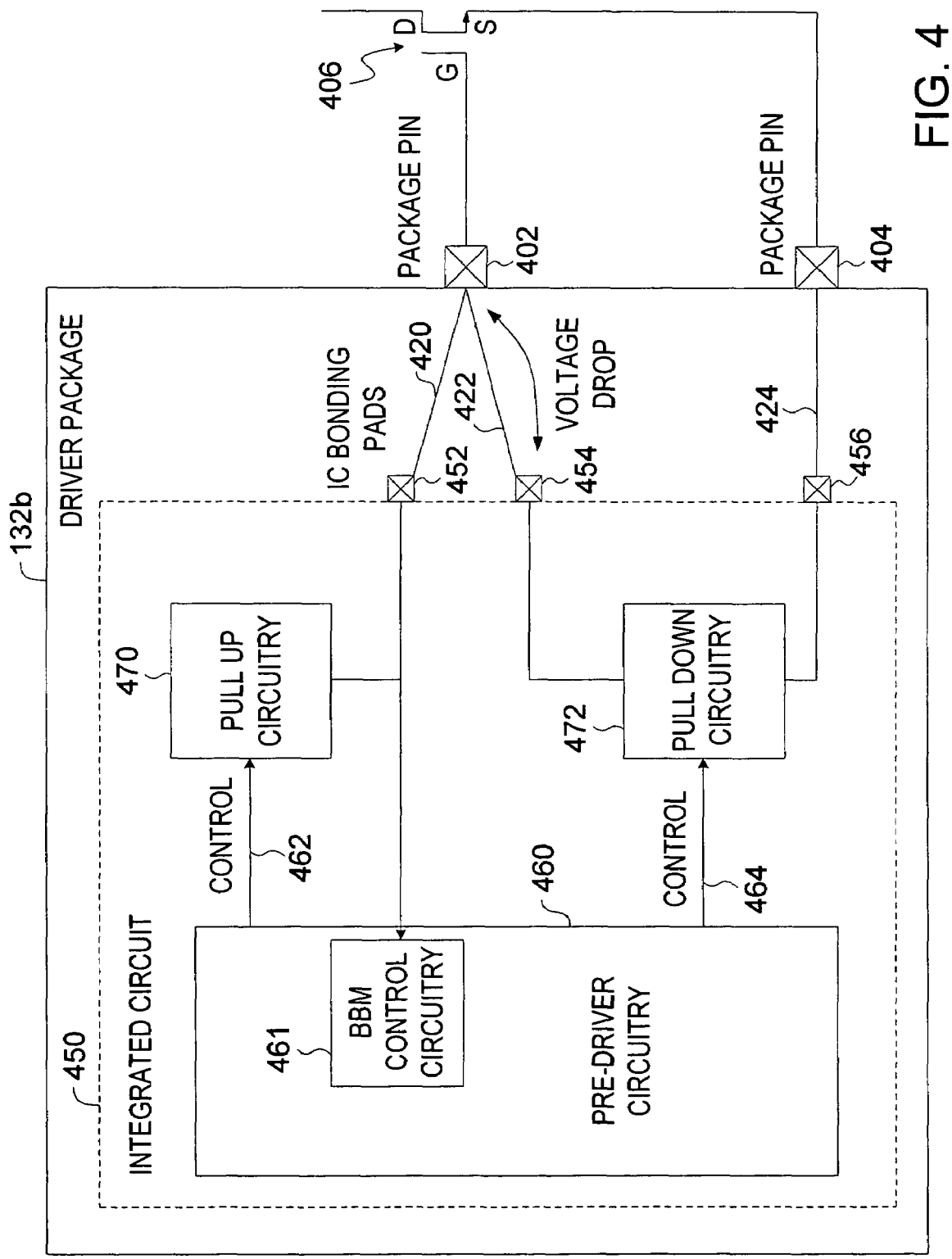
FIG. 4 is a block diagram of one embodiment of the driver package of FIGS. 1 and 2.

FIG. 4 illustrates an embodiment of a driver package 132b consistent with the driver packages of FIGS. 1 and 2 to help minimize the BBM time delay At. For clarity, the driver package 132b is illustrated as driving only one switch 406 and has a package pin 402 coupled to a control electrode of the switch 406. The switch 406 may be switch S1 or S2 in the embodiment of FIG. 2. The switch 406 may be any variety of transistors and in one embodiment may be a metal oxide semiconductor field effect transistor (MOSFET) as illustrated having its gate electrode coupled to the package pin 402 and its source electrode coupled to another package pin 404.

The driver package 132b may include an integrated circuit (IC) 450 having a plurality of IC bonding pads 452, 454, and 456. As used herein, an "integrated circuit" or IC means a semiconductor device and/or microelectronic device, such as, for example, a semiconductor integrated circuit chip. The semiconductor device may be silicon so that the IC bonding pads 452, 454, and 456 are at the silicon boundary.

The IC 450 may include pre-driver circuitry 460 to provide control signals along respective paths 462 and 464 to pull-up circuitry 470 and pull-down circuitry 472. As used herein, "circuitry" may comprise, for example, singly or in any combination, hardwired circuitry, programmable circuitry, state machine circuitry, and/or firmware that stores instructions executed by programmable circuitry. The pre-driver circuitry 460 may further include break before make control circuitry 461. The BBM control circuitry 461 may be responsive to a sensed voltage signal, e.g., the gate to source voltage level $V_{GS}$ of the MOSFET 406, to determine a state of the MOSFET. The BBM control circuitry 461 may compare the sensed $V_{GS}$ voltage level to a threshold voltage level. If the $V_{GS}$ voltage level is below the threshold level, the BBM control circuitry 461 may determine that the MOSFET is OFF. If the $V_{GS}$ voltage level is above the threshold level, the BBM control circuitry 461 may determine that the MOSFET is ON.

Pull up circuitry 470 may comprise various circuitries, e.g., a transistor, responsive to a control signal from the pre-driver 460 to turn ON the switch 406. Pull down circuitry 472 may comprise various circuitries, e.g., a transistor, responsive to a control signal from the pre-driver 460 to turn OFF the switch 406.

The driver package 132b may have a plurality of conductive paths, e.g., bonding wires made of any variety of conductive materials such as aluminum, copper, gold, etc., coupling the bonding pads 452, 454, and 456 of the IC 450 to package pins 402, 404 of the package 132b. Advantageously, two bonding pads 452 and 454 and two associated bonding wires 420 and 422 are both coupled to the package pin 402. Therefore, a first conductive path 420 may couple the bonding pad 452 to the package pin 402 and a second conductive 422 may couple the bonding pad 454 to the package pin 402. As such, any conditions on the second conductive path 422, e.g., a large voltage drop, may not adversely affect the first conductive path 420.

To assist with the BBM sequence, a voltage measurement may be made to provide an indication of the state of the switch 406. When the switch 406 is a MOSFET, a gate to source voltage level $V_{GS}$ of the MOSFET as measured at package pin 402 may provide this indication to the BBM control circuitry 461. During one time interval, conductive path 420 may be utilized to provide a sensed signal the BBM control circuitry 461. Since any adverse conditions, e.g., a voltage drop, that occurs on the second conductive path 422 does not adversely affect path 420, the voltage measurement, e.g., $V_{GS}$, may be reliable. The reliability of the sensed signal may then allow the BBM time delay instituted by the BBM control circuitry 461 to be minimized.

For example, during one time interval when switch 406 is ON, pull down circuitry 472 may provide a large driving current via the conductive path 422 to turn the switch 406 OFF. This may then result in a large voltage drop across the conductive path 422 which advantageously does not affect the voltage drop across path 420.

Figure 5:
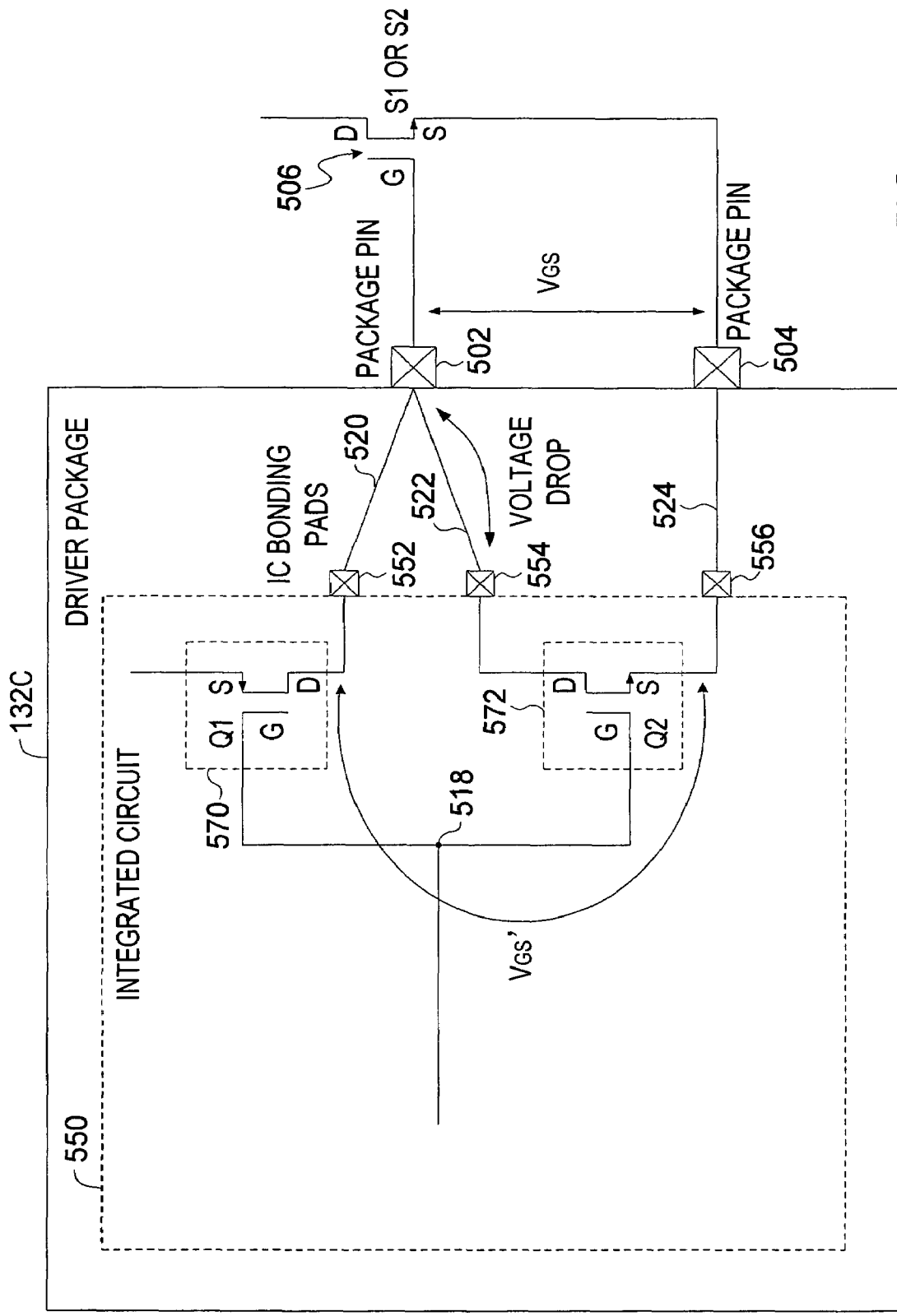
FIG. 5 is a circuit diagram of another embodiment of the driver package of FIGS. 1 and 2.

FIG. 5 illustrates another embodiment of driver package 132c. The driver package 132c may include an IC 550 having IC bonding pads 552, 554, and 556 at the boundary of the IC 550. For clarity, the driver package 132c is illustrated as driving only one switch 506 and has a package pin 502 coupled to a control electrode of the switch 506. The switch 506 may be switch S1 or S2 in the embodiment of FIG. 2. The switch 506 may be any variety of transistors and in one embodiment may be a MOSFET as illustrated having its gate electrode coupled to the package pin 502 and its source electrode coupled to another package pin 504.

The IC 550 may include pull up circuitry 570 and pull down circuitry 572. Pull up circuitry 570 may comprise transistor Q1 and pull down circuitry may comprise transistor Q2. Transistors Q1 and Q2 may be any variety of transistors and may have their respective control electrodes coupled together via node 518. In one embodiment, transistor Q1 may be a p-type metal oxide semiconductor field effect transistor (PMOS) and transistor Q2 may be an n-type metal oxide semiconductor field effect transistor (NMOS). The PMOS transistor Q1 may be utilized for turning the switch 506 ON and the NMOS transistor Q2 may be utilized for turning the switch 506 OFF.

A first bonding wire 520 may couple the IC bonding pad 552 to the package pin 502. The IC bonding pad 552 may also be coupled to a drain electrode of the PMOS transistor Q1. A second bonding wire 522 may couple another IC bonding pad 554 to the same package pin 502. The IC bonding pad 554 may be coupled to the drain electrode of the NMOS transistor Q2. Yet another bonding wire 524 may couple another IC bonding pad 556 to the package pin 504. Package pin 504 may be coupled to the source electrode of transistor 506. Advantageously, the two bonding wires 520 and 522 are both coupled to the package pin 502 such that any conditions on the second bonding wire 522, e.g., a large voltage drop, may not adversely affect the first bonding wire 520.

To assist with the BBM sequence, a voltage measurement may be made to provide an indication of the state of the switch 506. When the switch 506 is a MOSFET, a voltage across the gate and source electrodes of the MOSFET as measured across package pins 502 and 504 ($V_{GS}$) may provide this indication. BBM circuitry may compare this voltage level to a BBM threshold voltage level. If the voltage level is less than the BBM threshold, the BBM circuitry determines that the associated MOSFET is OFF. During one time interval, bonding wires 520 and 524 may be utilized to provide a sensed signal ($V_{GS'}$) to the drain electrode of transistor Q1 and the source and transistor Q2. Since any adverse conditions, e.g., a voltage drop, that occur on the second bonding wire 522 do not adversely affect bonding wires 520 and 524, the voltage measurement $V_{GS'}$ is approximately equal to $V_{GS}$. The reliability of the sensed signal $V_{GS'}$ may then allow the BBM time delay to be minimized.

For example, during one time interval when switch 506 is ON, transistor Q2 may provide a large driving current via the bonding wire 522 to turn the switch 506 OFF. This may then result in a large voltage drop across the bonding wire 522 which advantageously does not affect the voltage drop across bonding wire 520. Hence, $V_{GS'}$ is approximately equal to the $V_{GS}$ during this time interval.

In summary, there is thus provided a driver package. The driver package may comprise an IC comprising pull up circuitry capable of turning ON an associated switch and pull down circuitry capable of turning OFF the associated switch. The pull up circuitry may be coupled to a first bonding pad of the IC, and the pull down circuitry coupled to a second bonding pad of the IC. The driver package may further comprise a first conductive path coupled between the first bonding pad and a package pin of the driver package and a second conductive path coupled between the second bonding pad and the package pin. The associated switch may be coupled to the package pin.

There is also provided a DC to DC converter comprising a controller capable of providing a control signal, a switch, and a driver package having a package pin coupled to the switch. The driver package may be capable of accepting the control signal and providing a drive signal to the switch. The driver package may comprise an integrated circuit (IC) comprising pull up circuitry capable of turning ON the switch and pull down circuitry capable of turning OFF the switch. The pull up circuitry may be coupled to a first bonding pad of the IC, and the pull down circuitry may be coupled to a second bonding pad of the IC. The driver package may further comprise a first conductive path coupled between the first bonding pad and the package pin, and a second conductive path coupled between the second bonding pad and the package pin.

There is also provided an electronic device. The electronic device may comprise a DC to DC converter to accept an input power signal and provide an output power signal. The DC to DC converter may comprise a controller capable of providing a control signal, a switch, and a driver package having a package pin coupled to the switch, the driver package capable of accepting the control signal and providing a drive signal to the switch. The driver package may comprise an IC comprising pull up circuitry capable of turning ON the switch and pull down circuitry capable of turning OFF the switch. The pull up circuitry may be coupled to a first bonding pad of the IC, and the pull down circuitry may be coupled to a second bonding pad of the IC. The driver package may further comprise a first conductive path coupled between the first bonding pad and the package pin, and a second conductive path coupled between the second bonding pad and the package pin.

There is also provided a method. The method may comprise sampling a sensed signal representative of a state of a switch of a DC to DC converter during a first time interval via a first conductive path to determine a state of the switch; and providing a driving signal during the first time interval via a second conductive path to drive the switch.

Advantageously, the driver package of these embodiments may provide a reliable sensed signal that is not adversely affected by a voltage drop along the bonding wire, e.g., bonding wire 422, occurring when driving an associated switch. This sensed signal may be provided to BBM control circuitry enabling the BBM control circuitry to minimize a BBM time delay interval. Switching losses may also be minimized.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A driver package comprising:
   an integrated circuit (IC) comprising pull up circuitry capable of turning ON an associated switch and pull down circuitry capable of turning OFF said associated switch, said pull up circuitry coupled to a first bonding pad of said IC, and said pull down circuitry coupled to a second bonding pad of said IC;
   a first conductive path coupled between said first bonding pad and a package pin of said driver package, said associated switch coupled to said package pin;
   a second conductive path coupled between said second bonding pad and said package pin; and
   break before make (BBM) control circuitry, and wherein said first conductive path is capable of providing a sensed signal from said package pin to said BBM control circuitry representative of a state of said associated switch during a first time interval, and wherein said second conductive path is capable of providing a driving signal from said pull down device to said package pin during said first time interval.

2. The driver package of claim 1, wherein a voltage drop across said first conductive path due to said sensed signal is less than a voltage drop across said second conductive path due to said driving signal, and wherein said first conductive path comprises a first bonding wire and said second conductive path comprises a second bonding wire.

3. The driver package of claim 1, wherein said pull up device comprises a p-type metal oxide semiconductor field effect transistor and said pull down device comprises an n-type metal oxide semiconductor field effect transistor.

4. A DC to DC converter comprising:
   a controller capable of providing a control signal;
   a switch; and
   a driver package having a package pin coupled to said switch, said driver package capable of accepting said control signal and providing a drive signal to said switch, said driver package comprising:
      an integrated circuit (IC) comprising pull up circuitry capable of turning ON said switch and pull down circuitry capable of turning OFF said switch, said pull up circuitry coupled to a first bonding pad of said IC, and said pull down circuitry coupled to a second bonding pad of said IC;

a first conductive path coupled between said first bonding pad and said package pin; and a second conductive path coupled between said second bonding pad and said package pin; and break before make (BBM) control circuitry, and wherein said first conductive path is capable of providing a sensed signal from said package pin to said BBM control circuitry representative of a state of said associated switch during a first time interval, and wherein said second conductive path is capable of providing a driving signal from said pull down device to said package pin during said first time interval.

5. The DC to DC convener of claim 4 wherein a voltage drop across said first conductive path due to said sensed signal is less than a voltage drop across said second conductive path due to said driving signal, and wherein said first conductive path comprises a first bonding wire and said second conductive path comprises a second bonding wire.

6. The DC to DC converter of claim 4, wherein said pull up device comprises a p-type metal oxide semiconductor field effect transistor and said pull down device comprises an n-type metal oxide semiconductor field effect transistor.

7. An electronic device comprising:
a DC to DC converter to accept an input power signal and provide an output power signal, said DC to DC converter comprising:
a controller capable of providing a control signal;
a switch; and
a driver package having a package pin coupled to said switch, said driver package capable of accepting said control signal and providing a drive signal to said switch, said driver package comprising:
an integrated circuit (IC) comprising pull up circuitry capable of turning ON said switch and pull down circuitry capable of turning OFF said switch, said pull up circuitry coupled to a first bonding pad of said IC, and said pull down circuitry coupled to a second bonding pad of said IC;
a first conductive path coupled between said first bonding pad and said package pin; and
a second conductive path coupled between said second bonding pad and said package pin.

8. The electronic device of claim 7, wherein said IC further comprises break before make (BBM) control circuitry, and wherein said first conductive path is capable of providing a sensed signal from said package pin to said BBM control circuitry representative of a state of said associated switch during a first time interval, and wherein said second conductive path is capable of providing a driving signal from said pull down device to said package pin during said first time interval.

9. The electronic device of claim 8, wherein a voltage drop across said first conductive path due to said sensed signal is less than a voltage drop across said second conductive path due to said driving signal, and wherein said first conductive path comprises a first bonding wire and said second conductive path comprises a second bonding wire.

10. The electronic device of claim 7, wherein said pull up device comprises a p-type metal oxide semiconductor field effect transistor and said pull down device comprises an n-type metal oxide semiconductor field effect transistor.

11. A method comprising:
sampling a sensed signal representative of state of a switch of a DC to DC converter during a first time interval via a first conductive path to determine a state of said switch; and providing a driving signal during said first time interval via a second conductive path to drive said switch;

wherein said first conductive path couples a first bonding pad of an integrated circuit (IC) to a package pin of a driver package and wherein said second conductive path couples a second bonding pad of said IC to said package pin; and wherein a voltage drop across said first conductive path due to said sensed signal is less than a voltage drop across said second conductive path due to said driving signal, and wherein said first conductive path comprises a first bonding wire and said second conductive path comprises a second bonding wire.

12. The method of claim 11, wherein said sensed signal is provided to break before make control circuitry.

* * * * *